United States Patent
Feekes, Jr.

(10) Patent No.: US 10,209,761 B2
(45) Date of Patent: Feb. 19, 2019

(54) METHODS AND APPARATUS FOR A POWER MANAGEMENT UNIT

(71) Applicant: SEMICONDUCTOR COMPONENTS INDUSTRIES, LLC, Phoenix, AZ (US)

(72) Inventor: Dannie Gerrit Feekes, Jr., Corvallis, OR (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 227 days.

(21) Appl. No.: 15/398,177

(22) Filed: Jan. 4, 2017

(65) Prior Publication Data

US 2018/0188796 A1    Jul. 5, 2018

(51) Int. Cl.
| | |
|---|---|
| *G06F 1/28* | (2006.01) |
| *G06F 1/32* | (2006.01) |
| *H04N 5/369* | (2011.01) |
| *G11C 11/417* | (2006.01) |

(52) U.S. Cl.
CPC .............. *G06F 1/3275* (2013.01); *G06F 1/28* (2013.01); *G11C 11/417* (2013.01); *H04N 5/3698* (2013.01)

(58) Field of Classification Search
CPC ....... G06F 1/28; G06F 1/3275; G11C 11/417; H04N 5/3698
See application file for complete search history.

(56) References Cited

U.S. PATENT DOCUMENTS

| | | |
|---|---|---|
| 7,139,025 B1 | 11/2006 | Berezin |
| 2010/0073068 A1 | 3/2010 | Cho |
| 2012/0182450 A1* | 7/2012 | Sato ..................... H04N 5/3575 348/241 |
| 2013/0002901 A1 | 1/2013 | Athreya |
| 2013/0004071 A1 | 1/2013 | Chang |
| 2015/0229816 A1* | 8/2015 | Tomiyasu .............. H04N 5/232 348/207.99 |
| 2016/0091938 A1 | 3/2016 | Edwards |
| 2017/0019619 A1* | 1/2017 | Suzuki ................. H04N 5/3698 |

FOREIGN PATENT DOCUMENTS

EP    0942594 A2    9/1999

OTHER PUBLICATIONS

International Searching Authority, "Written Opinion of the International Searching Authority and International Search Report," dated Mar. 16, 2018.

* cited by examiner

*Primary Examiner* — Terrell S Johnson
(74) *Attorney, Agent, or Firm* — The Noblitt Group, PLLC; Hettie L. Haines

(57) ABSTRACT

Various embodiments of the present technology may comprise a method and apparatus for a power management unit. The power management unit may be configured to operate in conjunction other integrated circuits to mitigate power dissipation. The power management unit may receive temperature information from a temperature sensor and deploy various power management schemes to reduce the leakage power of an SRAM. The power management schemes may be based on the particular characteristics of the SRAM.

20 Claims, 3 Drawing Sheets

METHODS AND APPARATUS FOR A POWER MANAGEMENT UNIT

BACKGROUND OF THE TECHNOLOGY

Figure 1:
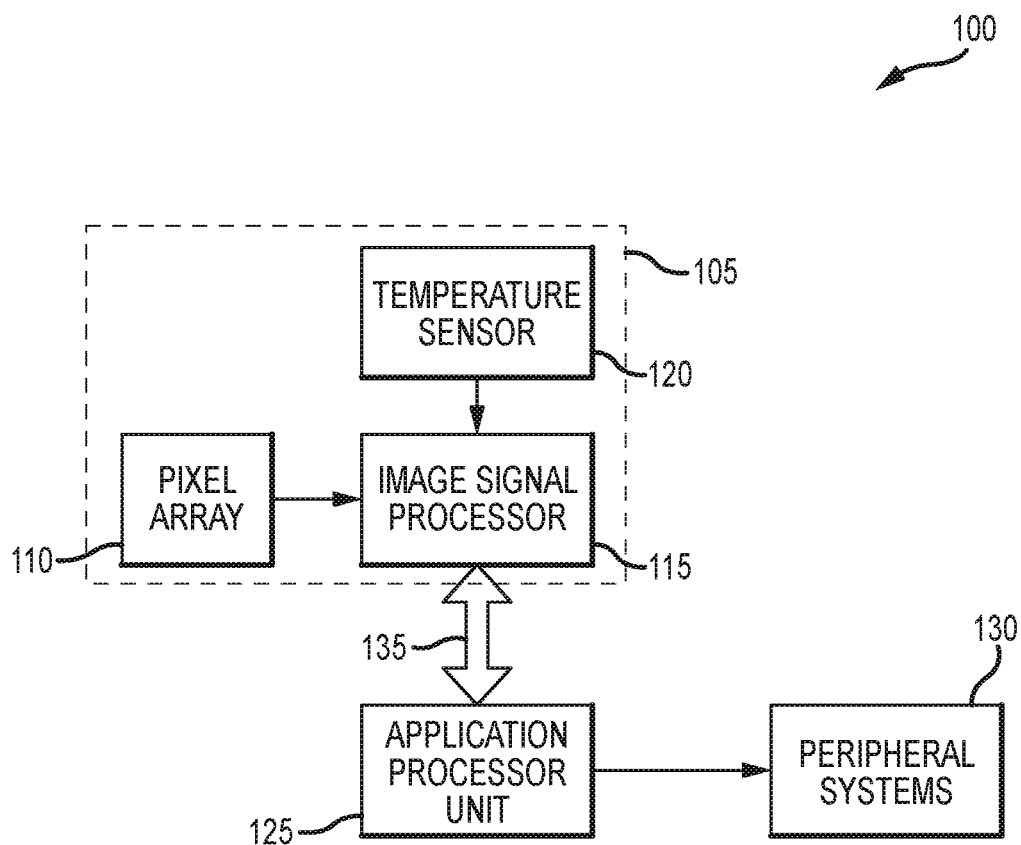

A System-On-Chip (SOC) typically includes an integrated electronic system on a single integrated circuit (IC) chip. As transistor size continues to shrink in submicron SOCs, transistor leakage power can correspondingly increase. Since transistor leakage power is a function of temperature, as the temperature of the SOC increases, the leakage power can also increase. When heat that is generated as a result of the leakage power and the active power from the SOC exceeds the heat dissipation capacity of the SOC package, chip temperature (junction temperature) can rise at a faster rate with increasing leakage power, thereby resulting in a process called "thermal runaway." Thermal runaway can damage and/or destroy the SOC resulting in a loss of functionality to the SOC. Preventing thermal runway and managing power consumption is important in applications where the SOC is used in conjunction with safety applications, such as those employed in Advanced Driver Assist Systems.

SUMMARY OF THE INVENTION

Various embodiments of the present technology may comprise a method and apparatus for a power management unit. The power management unit may be configured to operate in conjunction other integrated circuits to mitigate power dissipation. The power management unit may receive temperature information from a temperature sensor and deploy various power management schemes to reduce the leakage power of an SRAM. The power management schemes may be based on the particular characteristics of the SRAM.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
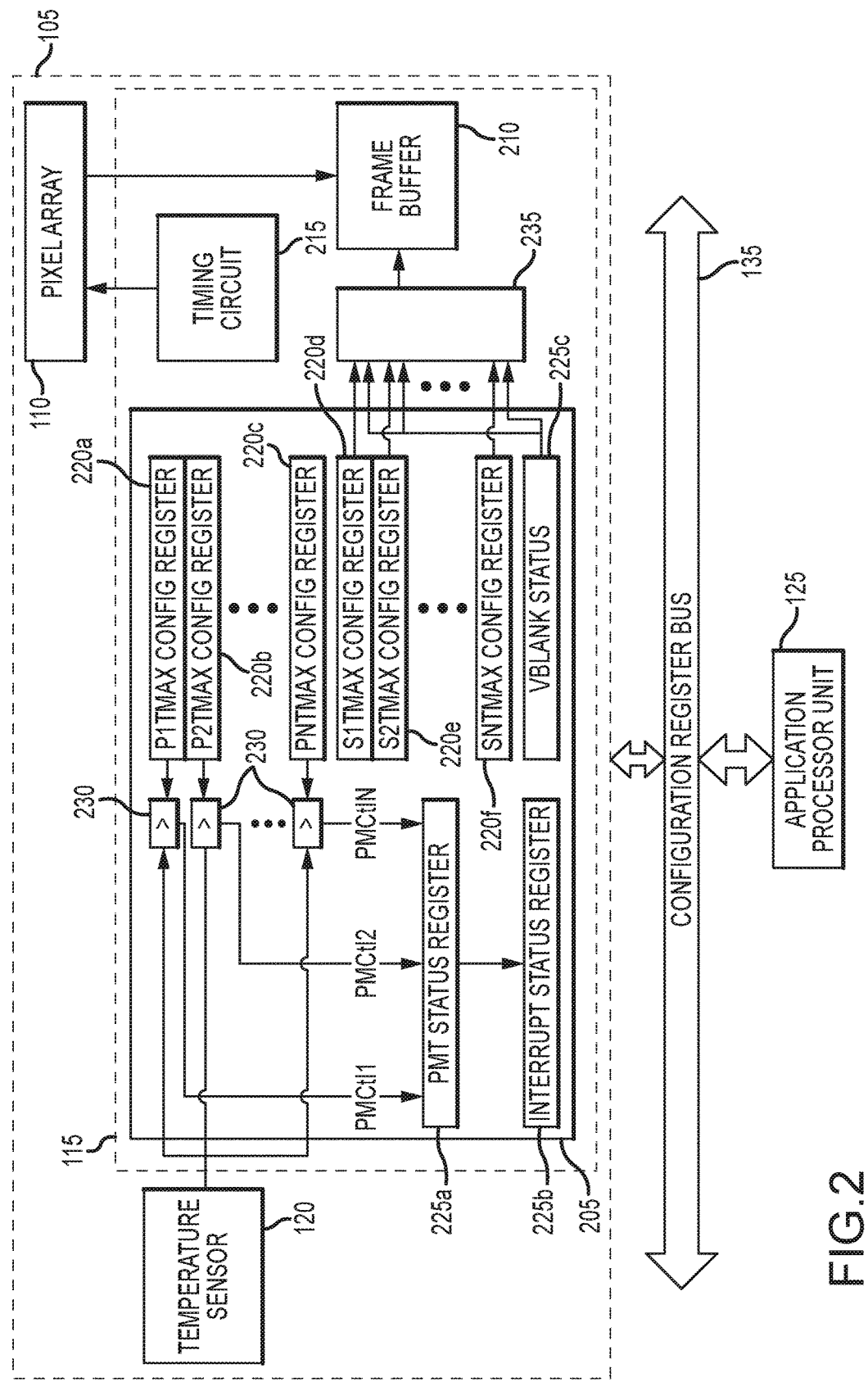
Figure 3:
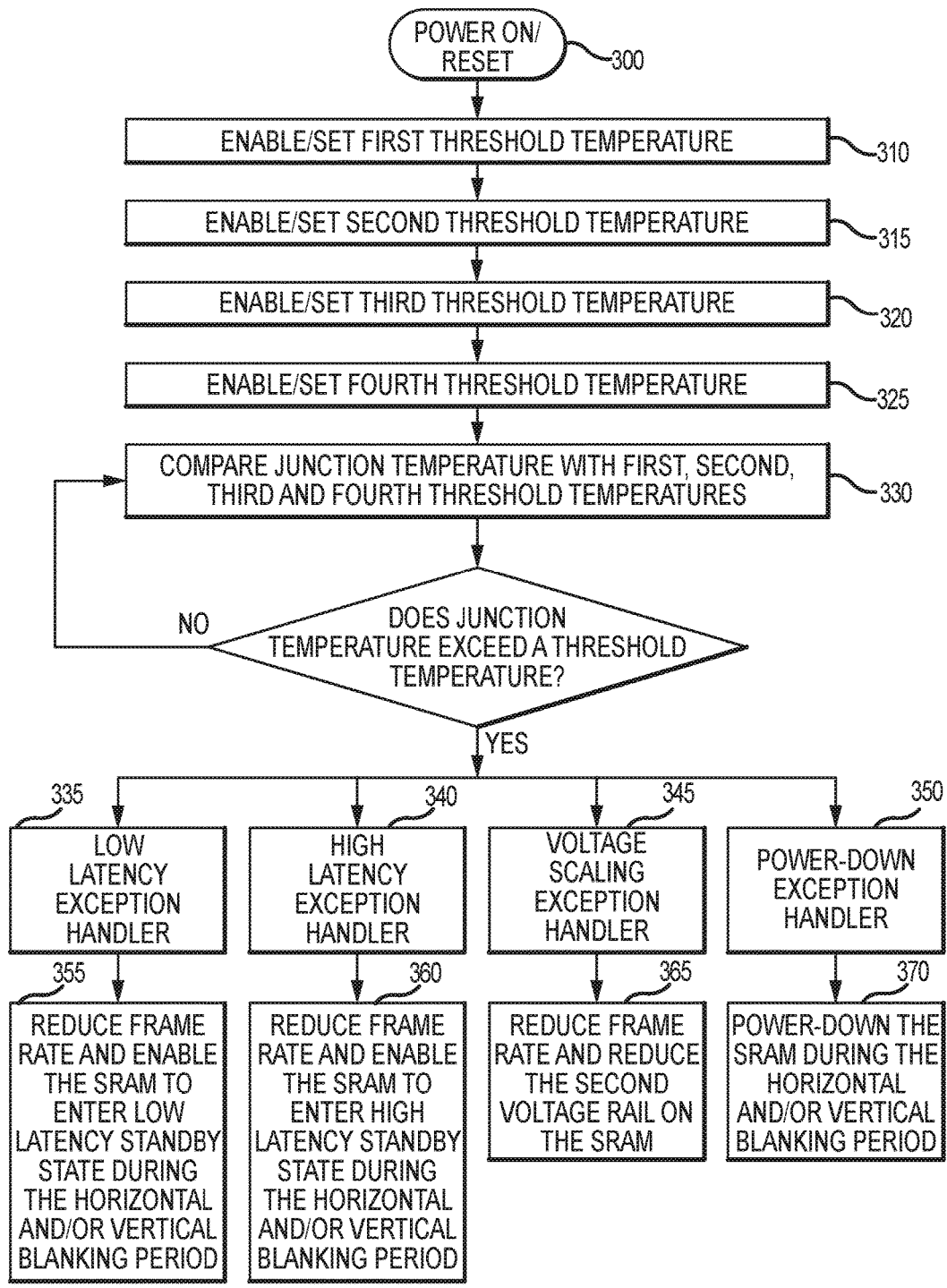

FIG. 1 representatively illustrates an imaging system in accordance with an exemplary embodiment of the present technology;

FIG. 2 is a block diagram of a leakage-mitigation system in accordance with an exemplary embodiment of the present technology; and FIG. 3 is a flow chart for power management in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various temperature sensors, analog-to-digital converters, storage devices, and semiconductor devices, such as: transistors, capacitors, image processing units, and the like, which may carry out a variety of functions. In addition, the present technology may be practiced in conjunction with any number of systems, such as automotive, aerospace, imaging, and consumer electronics, and the systems described are merely exemplary applications for the technology. Further, the present technology may employ any number of conventional techniques for capturing image data, sampling image data, processing image data, and the like.

Methods and apparatus for a power management unit according to various aspects of the present technology may operate in conjunction with any suitable electronic system, such as advanced driver assist systems, "smart devices," wearables, portable electronics, consumer electronics, and the like. Further, methods and apparatus for the power management unit may be utilized with any suitable imaging system, such as a camera system, video system, machine vision, vehicle navigation, surveillance system, motion detection system, and the like.

Referring to FIG. 1, an exemplary system may comprise a vehicle system, such as an advanced driver assistance system (ADAS) 100. The ADAS may comprise various integrated circuits configured to communicate with one or more peripheral systems 130, such as the vehicle braking system, steering system, and the like. The ADAS 100 may further comprise an image sensor 105 and an application processor unit (APU) 125.

The APU 125 may communicate with and control various devices, such as the image sensor 105 and the peripheral systems 130. The APU may comprise various circuits configured to perform various functions, such as data processing, decision-making, and the like. The APU 125 may operate in conjunction with other integrated circuits to perform desired functions. The various functions of the APU may be determined based on the specific application of the APU. In various embodiments, the APU may be configured to perform exception handling and/or configuration control. For example, the APU may transmit exception handlers to the image sensor 105 based on information related to a junction temperature and/or current power conditions of various components of the image sensor 105. The APU may comprise any hardware and/or software suitable for performing exception handling and/or configuration control.

The image sensor 105 captures image data and processes the image data. For example, light may enter and strike the image sensor 105. The image sensor 105 may be implemented in conjunction with any appropriate technology, such as active pixel sensors in complementary metal-oxide-semiconductors (CMOS). The image sensor 105 may be configured as an integrated circuit (i.e., a die) comprising multiple circuits to perform various functions. For example, the image sensor 105 may comprise a pixel array 110, an image signal processor 115, and a temperature sensor 120.

The pixel array 110 detects the light and conveys information that constitutes an image by converting the variable attenuation of waves (as they pass through or reflect off object) into electrical signals. The pixel array 110 may comprise a plurality of pixels (pixel circuits) arranged in rows and columns, and the pixel array 110 may contain any number of rows and columns, for example, hundreds or thousands of rows and columns. Each pixel circuit may include any number of photosensitive regions for collecting charge, such as a photogate, or photodiode. The pixel array 110 may be coupled to and transmit signals to the image signal processor 115.

In various embodiments, the image sensor 105 may further comprise a lens (not shown) configured to focus an image on the pixel array 110. For example the lens may include a fixed and/or adjustable focus lens.

In various embodiments, the image sensor 105 may further comprise a color filter system (not shown), such as a color filter array (CFA), to filter impinging light according to wavelength. The CFA may comprise a pattern of color filters situated on the pixel array 110 to capture color information. In the exemplary embodiment, each pixel in the pixel array 110 is covered with one color of the CFA. For example, a Bayer color filter array comprising a pattern of red, blue, and green filters may be provided, wherein each pixel is covered with one of a red, blue, or green filter. In other embodiments, the CFA may be formed using other color filters, such as a CYYM filter (one cyan, two yellow, and one magenta), a CYGM filter (one cyan, one yellow, one green, and one magenta), a CRGB filter (one cyan, one red, one green, and one blue), and any other suitable color pattern. In various embodiments, the CFA may comprise "clear" or transparent filter elements. The CFA may form a 2×2 color pattern, a 4×4 color pattern, a 2×4 color pattern, or any other suitable pattern size. In various embodiments, the CFA may repeat to cover the entire pixel array 110.

In various embodiments, the image sensor 105 may further comprise a microlens array (not shown) formed by a plurality of microlenses disposed on the pixel array 110 to help focus light on the pixels. The size and type of the microlenses may be selected for a particular application, and may be formed using conventional fabrication techniques and methods.

The image sensor 105 may further comprise a temperature sensor 120 suitably configured to monitor and report the temperature of the image sensor 105 (i.e., the image sensor die). The temperature sensor 120 may comprise any suitable device for monitoring and reporting temperature, such as a thermistor. The temperature sensor 120 may be configured to measure the junction temperature (actual operating temperature) of the image sensor 105. The temperature sensor 120 may be configured to transmit a signal corresponding to the measured temperature of the image sensor 105. The temperature sensor 120 may be coupled to the image signal processor 115, wherein the image signal processor 115 is responsive to the signals transmitted from the temperature sensor 120.

The image signal processor 115 may process the electrical signals received from the pixel array 110 and perform various signal processing functions, such as demosaicing, autofocus, noise reduction, white balance, and the like. The image signal processor 115 may further monitor power consumption and/or power dissipation of the image sensor 105 and/or make decisions to mitigate power dissipation due to leakage current drawn continuously from a power supply. The image signal processor 115 may further receive and respond to signals from the temperature sensor 120. For example, in various embodiments, the image signal processor 115 may configured to make decisions according to the signals transmitted from the temperature sensor 120. The image signal processor 115 may communicate with and operate in conjunction with the application processor unit 125 to perform desired functions and/or decision-making. The image signal processor 115 may be configured as an application-specific integrated chip or an application-specific standard chip, and may be selected according to desired processing functions. For example, and referring now to FIG. 2, the image signal processor 115 may comprise a power management unit 205, a frame buffer 210, and a timing circuit 215.

The frame buffer 210 may comprise any suitable device or system to temporarily store a frame of pixel data. In an exemplary embodiment, the frame buffer 210 may be implemented utilizing a memory device, such as an SRAM (static random-access memory) configured to store color values for each pixel in the pixel array 110 and/or other relevant data.

The SRAM may comprise a conventional SRAM array formed on a substrate using conventional components, such as transistors with a gate, a drain, and a source. For example, the SRAM may comprise a plurality of SRAM bit cells, wherein each SRAM bit cell comprises two access transistors and two cross-coupled inverters. The SRAM may further comprise peripheral control logic to control various operations, such as powering individual SRAM bit cells and/or switching a given SRAM bit cell from one state to a different state. For example, the SRAM bit cell may comprise a read state (data has been requested), a write state (updating the contents), a standby state (the circuit is idle), and/or a leakage mitigation state (e.g., a "transparent" mode), wherein the SRAM is still active (i.e., reading and writing), but operating at lower specifications to reduce power leakage. The SRAM bit cell may be coupled to one or more bit lines to transfer data during the read state and write state.

The timing circuit 215 controls the rate at which data is transmitted from the pixel array 110. In one embodiment, the timing circuit 215 may be coupled to the pixel array 110 and configured to control the transmission of pixel data out of the pixel array 110 and into the frame buffer 210. The timing circuit 215 may operate in conjunction with the APU 125 and/or power management unit 205 to control the readout of pixel data. For example, the pixels in the pixel array 110 are scanned out (readout) one row at a time from top to bottom and left to right to form an image frame. The timing circuit 215 may further be configured to control the total readout time by increasing or decreasing the time period between readout of adjacent rows and/or the time between readout of consecutive frames. For example, the timing circuit 215 may control a vertical blanking period, which is the time period between the end of one frame readout and the beginning of the next frame readout. The timing circuit 215 may further control a horizontal blanking period, which is the time period between the end of readout of one row and the beginning of readout of the next row. The total amount of time required to read out all the pixels in the pixel array 110 is referred to as a frame rate. The frame rate, the horizontal blanking period, and the vertical blanking period may be described according to a number of clock cycles.

The power management unit (PMU) 205 monitors and responds to temperature changes in the image sensor 105. For example, the PMU 205 may transmit various signals to the APU 125 indicating a particular condition of the image sensor 105. The APU 125 may respond to such signals by varying the readout operations of the image sensor 105. For example, the APU 125 may transmit a signal to the timing circuit 215 to control the horizontal blanking period and/or the vertical blanking period.

The PMU 205 may comprise any number of components suitable for monitoring the actual temperature of the image sensor 105, storing one or more predetermined temperature values, comparing the actual temperature to one or more of the predetermined temperature values, and transmitting various signals according to the outcome of the comparison. For example, the PMU 205 may comprise a plurality of configurable storage devices 220a-f, a status register 225, a logic unit 235, and a compare circuit 230.

In various embodiments, the PMU 205 may employ one or more power management schemes to operate the SRAM (frame buffer 210) and/or the image sensor 105 under predetermined conditions. A given power management scheme may control any suitable function or condition such as power consumption and/or leakage current of the frame buffer 210 and/or control the frame rate of the image sensor 105. Each power management scheme may mitigate leakage and/or allow the SRAM to continue to operate at a reduced power consumption level. For example, in various embodiments, the SRAM may comprise the standby state and/or the leakage mitigation state, wherein portions of the SRAM peripheral control logic can be powered down while maintaining the current state (e.g., reading or writing) of the SRAM. Additionally, or in alternative embodiments, the SRAM may comprise the standby state and/or the leakage mitigation state, wherein the bit lines of the SRAM bit cell can be floated while maintaining the current state of the SRAM. Additionally, or in alternative embodiments, the SRAM may comprise a second voltage rail that can be lowered while maintaining the current state of the SRAM. Additionally, or in alternative embodiments, a supply voltage for the SRAM (SRAM supply voltage) may be raised to reduce current leakage between the drain and the substrate of the SRAM bit cell when the SRAM is in the standby state or the leakage mitigation state.

The power management schemes may be established according to any suitable requirements of the system 100 and/or image sensor 105, such as the latency requirements of the image sensor 105 and/or based on the particular characteristics and specifications (e.g., operating temperatures, operating power, operating current, operating voltage, etc.) of the SRAM. For example, the power management schemes may be configured to: reduce the frame rate and enable the SRAM to enter a low latency standby state during the horizontal and/or vertical blanking periods, such as increasing the horizontal and/or vertical blanking periods; reduce the frame rate and enable the SRAM to enter a high latency standby state during the horizontal and/or vertical blanking periods, such as increasing the horizontal and/or vertical blanking periods and floating the SRAM bit lines and reducing the gate-to-substrate current; reduce the frame rate and reduce the second voltage rail on the SRAM; and/or power-down the SRAM during the horizontal and/or vertical blanking periods when thermal runaway and out-of-specification conditions are detected.

The storage devices 220a-f may store various predetermined threshold values relating to various power management schemes and/or operating temperatures of the image sensor 105. The storage devices 220a-f may comprise any suitable device capable of storing a programmed value. The storage devices 220a-f may comprise a configurable register programmed with the predetermined value, such as a temperature value or a latency time. For example, the storage devices 220a-c may store predetermined threshold temperature values, while the storage devices 220d-f may store a maximum latency time, or a value that corresponds to a particular power management scheme.

The threshold temperature value and maximum latency time may be selected according to the operating specifications of the image sensor 105 and/or the frame buffer 210, wherein each temperature threshold and/or maximum latency time effects a different change in the operation and selected power management scheme. In an exemplary embodiment, each storage device 220a-c is programmed with different threshold temperatures and each storage device 220d-f is programmed with different maximum latency times.

The compare circuit 230 compares two input values and outputs a signal indicating the relationship between the two input values. The compare circuit 230 may comprise any suitable circuit for comparing two input values and outputting a value indicating which of the two inputs value is greater, such as a conventional comparator. For example, the compare circuit 230 may compare the actual temperature with the threshold temperature value to determine if the actual temperature exceeds the threshold temperature value. The compare circuit 230 may be coupled, at one input, to the temperature sensor 120 to receive temperature data and, at another input, to the storage device 220a. The threshold temperature value stored in the storage device 220a may be compared to the actual temperature from the temperature sensor 120 to determine if the actual temperature exceeds threshold value. The result of the compare circuit 230 may be transmitted to a status register, such as status register 225a.

The PMU 205 may comprise various status registers 225a-c to store information received from another device, such as comparison data, interrupt data, and/or timing data. For example, a temperature status register 225a may contain information related to the result of the compare circuit 230. The temperature status register 225a may contain information related to whether or not the actual temperature exceeds the predetermined threshold temperature. The temperature status register 225a may continuously update the stored information according to the input data from the compare circuit 230.

Similarly, an interrupt status register 225b may store interrupt data. The interrupt status register 225b may be coupled to receive input data from the temperature status register 225a and may transmit data based on the input data received from the temperature status register 225a. For example, the interrupt status register 225b may be configured to transmit an interrupt signal to the APU 125 if the temperature status register 225a indicates that the actual temperature exceeds the threshold temperature.

A timing status register 225c may store timing information, such as the number of clocks for the horizontal blanking period and/or the vertical blanking period. The timing status register 225c may be coupled to receive input data from the timing circuit 215 and/or the APU 125 and may transmit data based on the input data received. For example, the timing status register 225c may be configured to transmit a signal to the logic unit 235.

The logic unit 235 performs various operations and decision-making to control the state of the SRAM. For example, the logic unit 235 may receive data from the storage devices 220d-f and the timing status register 225c to control individual SRAM bit cells. The logic unit 235 may comprise any number of logic gates and/or other devices suitable to carry out the desired function. For example, the logic unit 235 may place selected SRAM bit cells into the standby state or the leakage mitigation state based on the data from the storage devices 220d-f and the timing status register 225c. The logic unit 235 may be configured to transmit a signal to one or more SRAM bit cells to control the state of the selected SRAM bit cells.

Referring to FIGS. 1, 2, and 3, the PMU 205 in the image signal processor 115 may operate in conjunction with the APU 125 to prevent thermal runaway of the frame buffer 210 by managing the frame rate of the pixel data received from the pixel array 110. The image signal processor 115 may be further configured to minimize leakage in the frame buffer 210 during the horizontal and/or vertical blanking periods. As the temperature of the image signal processor 115 reaches predetermined temperature thresholds, interrupt signals may be generated to allow the APU 125 to execute exception handlers for the present temperature and power conditions. The exception handlers may provide for varying levels of frame rate control and SRAM power management schemes to ensure that the system 110 is able to maintain certain functionality, such as continuing to provide reliable image data, as the temperature of the image signal processor 115 approaches and/or exceeds a maximum specification temperature.

In operation, and upon power on or reset (300), the PMU 205 may enable and/or set a first threshold temperature (310). For example, the first threshold temperature may be stored in a first storage device, for example storage device 220*a*. The first threshold temperature may be a temperature value less than the maximum specification temperature of the image signal processor 115. The PMU 205 may further may enable and/or set a second threshold temperature (315). For example, the second threshold temperature may be stored in a second storage device, for example storage device 220*b*. The second threshold temperature may be a temperature value greater than the first threshold temperature and less than or equal to the maximum specification temperature of the image signal processor 115. The PMU 205 may further may enable and/or set a third threshold temperature (320). For example, the third threshold temperature may be stored in a third storage device. The third threshold temperature may be a temperature value greater than the second threshold temperature and greater than the maximum specification temperature of the image signal processor 115. The PMU 205 may further may enable and/or set a fourth threshold temperature (325). For example, the fourth threshold temperature may be stored in a fourth storage device. The fourth threshold temperature may be a temperature value greater than the third threshold temperature and the maximum specification temperature of the image signal processor 115. The fourth threshold temperature may correspond to thermal runaway conditions.

During operation, the temperature sensor 120 may continuously measure the junction temperature of the image signal processor 115. The compare circuit 230 may then compare the measured junction temperature with the first, second, third, and fourth threshold temperatures (330). In one embodiment, the PMU may 205 may implement a power management scheme comprising four different exception handlers, where each exception handler corresponds to a particular threshold temperature. For example, if the measured junction temperature is greater than the first threshold temperature (325), then the PMU 205 may send a first interrupt signal to the APU 125. The APU 125 may respond to the first interrupt signal by transmitting a low latency exception handler (335) to various components in the image signal processor 115, such as the timing circuit 215 and the timing status register 225*c*, to reduce the frame rate and enable the SRAM to enter a low latency standby state during the horizontal and/or vertical blanking periods (355).

If the measured junction temperature is greater than the second threshold temperature (325), then the PMU 205 may send a second interrupt signal to the APU 125. The APU 125 may respond to the second interrupt signal by transmitting a high latency exception handler (340) to various components in the image signal processor 115, such as the timing circuit 215 and the timing status register 225*c*, to reduce the frame rate and enable the SRAM to enter a high latency standby state during the horizontal and/or vertical blanking periods (360).

If the measured junction temperature is greater than the third threshold temperature (325), then the PMU 205 may send a third interrupt signal to the APU 125. The APU 125 may respond to the third interrupt signal by transmitting a voltage scaling exception handler (345) to various components in the image signal processor 115, such as the timing circuit 215, the timing status register 225*c*, and the SRAM, to reduce the frame rate and reduce the second voltage rail on the SRAM (365).

If the measured junction temperature is greater than the fourth threshold temperature (325), this may indicate thermal runaway conditions, and the PMU 205 may send a fourth interrupt signal to the APU 125. The APU 125 may respond to the fourth interrupt signal by transmitting a power-down exception handler (350) to various components in the image signal processor 115, such as the timing circuit 215, the timing status register 225*c*, and the SRAM, to power-down the SRAM during the horizontal and/or vertical blanking periods (370).

Systematically controlling the power conditions of the SRAM by utilizing various power management schemes implemented by the PMU 205 and the APU 125, may allow the image signal processor 115 to continue to provide reliable image data to the peripheral systems 130 through the APU 125. Various sub-systems, such as the peripheral systems 130 that operate in conjunction with an ADAS, may be responsible for various safety features of the ADAS. Therefore, the safety features may not operate properly and/or may fail completely if reliable image data is not provided.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A power management apparatus capable of receiving temperature data from a temperature sensor, comprising:
    a power management unit comprising:
        a plurality of storage devices, wherein each storage device stores a different predetermined threshold temperature value; and
        a plurality of compare circuits, each compare circuit coupled to the temperature sensor and configured to:
            compare the temperature data with one of the threshold temperature values; and
            transmit a signal corresponding to a result of the comparison;
    an application processor unit coupled to the power management unit and responsive to the transmitted signal from any compare circuit from the plurality of compare circuits, wherein the application processor unit implements a predetermined power management scheme, based on the transmitted signal from any compare circuit from the plurality of compare circuits, to control:
        a timing circuit coupled to the application processor unit and responsive to the implemented power management scheme, wherein the timing circuit controls at least one of a vertical blanking period and a horizontal blanking period according to the selected power management scheme; and
        an SRAM, comprising a plurality of SRAM bit cells, coupled to the application processor unit and responsive to the implemented power management scheme, wherein the SRAM bit cells are capable of entering at least one of a leakage mitigation state and a standby state according to the selected power management scheme.

2. The power management apparatus according to claim 1, wherein the predetermined threshold temperature values are selected according to at least one of a thermal specification and a latency requirement of the SRAM.

3. The power management apparatus according to claim 1, wherein:
    a first storage device stores a first predetermined threshold temperature that is less than a maximum specification temperature of the SRAM;
    a second storage device stores a second threshold temperature that is greater than the maximum specification temperature of the SRAM.

4. The power management apparatus according to claim 1, wherein the predetermined power scheme is based on a particular specification of the SRAM.

5. The power management apparatus according to claim 4, wherein the SRAM bit cells comprise bit lines, and the bit lines can be floated while maintaining a current state of the SRAM.

6. The power management apparatus according to claim 4, wherein the SRAM may comprise a second voltage rail that can be lowered while maintaining a current state of the SRAM.

7. The power management apparatus according to claim 4, wherein portions of the SRAM can be powered down while maintaining a current state of the SRAM.

8. The power management apparatus according to claim 4, wherein an SRAM supply voltage is capable of being increased to reduce current leakage between a drain and a substrate of at least one of the SRAM bit cells.

9. A method for managing power consumption of an SRAM in an image sensor die, comprising:
    establishing a predetermined threshold temperature based on operating specification temperatures of the image sensor die;
    measuring a junction temperature of the image sensor die;
    comparing the junction temperature to the predetermined threshold temperature; and
    implementing a power management scheme based on the junction temperature exceeding the threshold temperature;
    controlling the power consumption of the SRAM according to the implemented power management scheme; and
    controlling a frame rate of the image sensor die according to the implemented power management scheme.

10. The method for managing power consumption of an SRAM in an image sensor die according to claim 9, wherein controlling the frame rate of the image sensor die comprises increasing at least one of a horizontal blanking period and a vertical blanking period.

11. The method for managing power consumption of an SRAM in an image sensor die according to claim 9, wherein the power management scheme enables the SRAM to enter a high latency standby state during at least one of a horizontal blanking period and a vertical blanking period.

12. The method for managing power consumption of an SRAM in an image sensor die according to claim 9, wherein the power management scheme enables the SRAM to enter a low latency standby state during at least one of a horizontal blanking period and a vertical blanking period.

13. The method for managing power consumption of an SRAM in an image sensor die according to claim 9, wherein the power management scheme reduces the frame rate and decreases a voltage rail of the SRAM.

14. The method for managing power consumption of an SRAM in an image sensor die according to claim 9, wherein the power management scheme powers-down the SRAM during at least one of a horizontal blanking period and a vertical blanking period when a thermal runaway condition is detected.

15. The method for managing power consumption of an SRAM in an image sensor die according to claim 9, wherein the predetermined threshold temperature is greater than a maximum operating specification temperature of the image sensor die.

16. An imaging system capable of mitigating power leakage, comprising:
   an image sensor die comprising:
      a pixel array to capture and transmit image data;
      a sensor to measure a temperature of the image sensor die and generate temperature data;
      an image signal processor, coupled to the pixel array and configured to receive the image data, comprising:
         a power management unit comprising:
            a plurality of storage devices, wherein each storage device stores a different predetermined threshold temperature value; and
            a plurality of compare circuits, each compare circuit coupled to the sensor and configured to:
               compare the temperature data with one of the threshold temperature values; and
               transmit a first signal corresponding to a result of the comparison;
         a timing circuit coupled to the pixel array, wherein the timing circuit controls a frame rate of the image sensor die; and
         a frame buffer, comprising a plurality of memory cells, coupled to the pixel array to temporarily store the image data, wherein the frame buffer is capable of being placed in at least one of a leakage mitigation state and a standby state; and
      an application processor unit coupled to the power management unit and responsive to the first signals from the plurality of compare circuits, wherein the application processor unit selects a predetermined power management scheme based on the first signal from each of the compare circuits and controls:
         the frame rate; and
         at least one of the leakage mitigation state and the standby state of the frame buffer.

17. The imaging system capable of mitigating power leakage according to claim 16, wherein the predetermined threshold temperature value of each storage device is selected according to at least one of a particular thermal specification and a latency requirement of the image signal processor.

18. The imaging system capable of mitigating power leakage according to claim 16, wherein the predetermined power scheme is based on a particular specification of the frame buffer.

19. The imaging system capable of mitigating power leakage according to claim 16, wherein:
   the frame rate is based on at least one of a vertical blanking period and a horizontal blanking period; and
   the power management scheme operates to increase at least one of the vertical blanking period and the horizontal blanking period.

20. The imaging system capable of mitigating power leakage according to claim 16, wherein:
   a first storage device stores a first predetermined threshold temperature that is less than a maximum specification temperature of the image signal processor; and
   a second storage device stores a second threshold temperature that is greater than the maximum specification temperature of the image signal processor.

* * * * *